United States Patent [19]
Maruyama et al.

[11] Patent Number: 6,144,233
[45] Date of Patent: Nov. 7, 2000

[54] GAIN CONTROL CIRCUIT FOR CONTROLLING OPERATION OF A VARIABLE-GAIN AMPLIFIER OR THE LIKE

[75] Inventors: Takaya Maruyama; Hisayasu Sato, both of Tokyo, Japan

[73] Assignee: Mitsubishi Denki Kabushiki Kaisha, Tokyo, Japan

[21] Appl. No.: 09/350,916

[22] Filed: Jul. 12, 1999

[30]  Foreign Application Priority Data

Mar. 12, 1999 [JP]  Japan ................................. 11-067430

[51] Int. Cl.[7] ................................................. H03K 5/153
[52] U.S. Cl. .................................................. 327/77; 327/83
[58] Field of Search ............................... 327/77, 83, 560, 327/561, 562, 563; 330/254, 256, 278, 289

[56]  References Cited

U.S. PATENT DOCUMENTS

| | | | |
|---|---|---|---|
| 5,068,595 | 11/1991 | Kearney et al. | 330/256 |
| 5,268,872 | 12/1993 | Fujii et al. | 327/415 |
| 5,325,070 | 6/1994 | McGinn | 330/256 |

OTHER PUBLICATIONS

Meyer, Robert G., "A DC to 1–GHz Differential Monolithic Variable–Gain Amplifier," *IEEE J. Solid–State Circuits*, vol. SC–26, No. 11, Nov. 1991, pp. 1673–1680.

*Primary Examiner*—Tuan T. Lam
*Assistant Examiner*—Paul Dinh
*Attorney, Agent, or Firm*—Burns, Doane, Swecker & Mathis, LLP

[57]  ABSTRACT

A gain control circuit includes a first path block for a gain control voltage and a second path block for a reference voltage. The first path block includes a voltage-current linear conversion unit for outputting a current which is proportional to a gain control voltage $V_{ctrl}$, and which is inversely proportional to a resistivity, and also includes a temperature characteristic compensation unit for mirroring the current output by the voltage-current linear conversion unit and outputting a current $I_{ctrl}$ which is proportional to the gain control voltage $V_{ctrl}$ and an absolute temperature, and which is inversely proportional to the resistivity. The second path block has the same construction as the first path block except that it receives a reference voltage $V_{ref}$ and outputs a current $I_{ref}$. The current $I_{ctrl}$ and the current $I_{ref}$ are supplied to a variable- gain cell so as to produce a voltage gain $A_v$ not affected by a variation in temperature.

6 Claims, 6 Drawing Sheets

GAIN CONTROL CIRCUIT FOR CONTROLLING OPERATION OF A VARIABLE-GAIN AMPLIFIER OR THE LIKE

BACKGROUND OF THE INVENTION

1. Field of the Invention

The present invention generally relates to gain control circuits and, more particularly, to a gain control circuit for controlling an operation of a variable-gain amplifier or the like for use in wireless transmitters and receivers.

2. Description of the Related Art

The development of mobile wireless communication technology is occurring at a considerable growth rate. Mobile wireless communication occurs between a base station and a mobile station. When the distance between the mobile station and the base station changes, or when an obstacle to radio communication such as a building is located between the mobile station and the base station, the signal intensity at a wireless transmitter or a wireless receiver changes significantly.

In order for signals to be correctly transmitted and received in mobile communication, it is required and desirable that a change in signal intensity be controlled to be at a minimum level. For this reason, it is necessary to introduce power control whereby an amplifier gain is enlarged when a signal intensity is small and reduced when a signal intensity is large. A variable-gain amplifier capable of controlling a gain depending on the signal intensity should be provided in a mobile wireless communication system.

FIG. 7 is a circuit diagram showing a variable-gain amplifier (variable-gain cell) of a current switch type according to the related art. Referring to FIG. 7, the variable-gain amplifier includes an input terminal 71 for receiving an input signal at a voltage $V_{in}$, an output terminal 72 for outputting an amplified or attenuated signal at a voltage $V_{out}$, a current switch 73, a load 74 and a differential amplifier 75. A description will now be given of the operation according to the related art.

When the input signal at the voltage $V_{in}$ is supplied to the input terminal 71 in the variable-gain amplifier shown in FIG. 7, the amplified or attenuated signal at the voltage $V_{out}$ is output from the output terminal 72.

Whether the input signal at the voltage $V_{in}$ is amplified or attenuated depends on a gain performance of the amplifier controlled in accordance with a gain control voltage $V_{ctrl0}$. The gain control voltage is fed to the current switch 73. The current switch 73 shunts a collector current of the differential amplifier 75 and supplies the shunted current to the load 74. Thus, the gain of the input signal at the voltage $V_{in}$ is controlled in accordance with the gain control voltage $V_{ctrl0}$.

A voltage gain of the related-art variable-gain amplifier shown in FIG. 7 will now be calculated. An emitter current supplied to the differential amplifier 75 of the related-art variable-gain amplifier is proportional to an absolute temperature and inversely proportional to resistivity. Generally, the emitter current having such a characteristic is generated by a band-gap voltage generation circuit.

An ac output small-signal $i_c$ of the differential amplifier 75 in relation to the input signal voltage $V_{in}$ is given by the following equation $$i_c = \frac{q}{kT} \frac{K_1}{\rho(T)} T v_{in} \qquad (1)$$

where q indicates an elementary electric charge, k indicates Boltzmann constant, T indicates an absolute temperature, $K_1$ indicates a constant, and ρ indicates a resistivity of a semiconductor chip in which the variable-gain amplifier shown in FIG. 7 is formed. The resistivity ρ has temperature dependence.

The above equation (1) is used to determine the output voltage $V_{out}$ of the current switch 73 in relation to the gain control voltage $V_{ctrl}$. Thus, $$v_{out} = \frac{i_c}{1 + \exp\left(-\frac{q}{kT}V_{ctrl0}\right)} K_R \rho(T) \qquad (2)$$

$$= \frac{\frac{q}{kT}\frac{K_1}{\rho(T)}Tv_{in}}{1 + \exp\left(-\frac{q}{kT}V_{ctrl0}\right)} K_R \rho(T)$$

where $K_R$ is a constant. Referring to the equation (3), the gain control voltage $V_{ctrl0}$ is set to satisfy the relation $$\exp((-q/kT) \cdot V_{ctrl0}) \gg 1$$

The equation (2) above may be simplified as follows.

$$v_{out} = \frac{q}{kT}\frac{K_1}{\rho(T)} T v_{in} \exp\left(\frac{q}{kT}V_{ctrl0}\right) K_R \rho(T) \qquad (3)$$

$$= \frac{q}{k} K_1 v_{in} \exp\left(\frac{q}{kT}V_{ctrl0}\right) K_R$$

From the equation (3) above, a voltage gain $A_v$ is given by the equation (4) below.

$$A_v = \frac{v_{out}}{v_{in}} \qquad (4)$$

$$= \frac{q}{k} K_1 \exp\left(\frac{q}{kT}V_{ctrl0}\right) K_R$$

The equation (4) shows that the voltage gain $A_v$ has temperature dependence such that it decreases as the temperature rises.

FIG. 8 is a graph showing the temperature dependence of a variable-gain amplifier according to the related art. For example, FIG. 8 shows that the voltage gain $A_v$ varies greatly as the temperature varies between 200K and 400K.

As described above, the variable-gain amplifier according to the related art has a drawback in that the voltage gain $A_v$ varies significantly as the temperature varies, presenting a problem in mobile communication. The gain control characteristic preferably remains unchanged regardless of a temperature variation. In other words, there is a demand for a variable-gain amplifier having a voltage gain $A_v$ not affected by a temperature variation.

SUMMARY OF THE INVENTION

An object of the present invention is to provide a gain control circuit in which the aforementioned drawback is eliminated.

Another and more specific object of the present invention is to provide a variable-gain amplifier in which the temperature dependence of the gain control characteristic, such as the characteristic of the gain control voltage, is eliminated.

The aforementioned objects can be achieved by a gain control circuit comprising: a first voltage-current linear conversion unit for receiving a gain control voltage and outputting a current which is proportional to the gain control voltage, and which is inversely proportional to a resistivity of a resistance in the gain control circuit; a first temperature characteristic compensation unit for receiving a current obtained by mirroring the current output by the first voltage-current linear conversion unit and for outputting a first current which is proportional to the gain control voltage and a temperature, and which is inversely proportional to the resistivity; a second voltage-current linear conversion unit for receiving a reference voltage and outputting a current which is proportional to the reference voltage, and which is inversely proportional to the resistivity; and a second temperature characteristic compensation unit for receiving a current obtained by mirroring the current output by the second voltage-current linear conversion unit and for outputting a second current which is proportional to the reference voltage, and the temperature, and which is inversely proportional to the resistivity.

The gain control circuit may further comprise a control voltage generation unit for receiving the first current and the second current and generating a voltage which is proportional to a difference between a magnitude of the first current and that of the second current, and which is inversely proportional to the resistivity.

The control voltage generation unit may further comprise: a first control voltage generation current source for generating a mirror current of the first current; a second control voltage generation current source for generating a mirror current of the second current; a first resistor connected in series with the first control voltage generation current source; a second resistor connected in series with the second control voltage generation current source, wherein the first resistor and the second resistor are connected to a common power source, and wherein a voltage is retrieved across a connection node between the first control voltage generation current source and the first resistor, and a connection node between the second control voltage generation current source and the second resistor.

The gain control circuit may further comprise an exponential current generation unit which receives the first current and the second current, the exponential current generation unit further comprising: a first exponential current generation current source for generating a mirror current of the first current; a second exponential current generation current source for generating a mirror current of the second current; a third exponential current generation current source for generating a current which is proportional to the temperature, and which is inversely proportional to the resistivity; and a differential amplifier including a first differential amplifier transistor having a base thereof connected to the first exponential current generation current source and connected to a common power source via a resistor, and a second differential amplifier transistor having a base thereof connected to the second exponential current generation current source and connected to the common power source via another resistor, emitters of the first and second differential amplifier transistors being connected to the third exponential current generation current source, and a collector current of the second differential amplifier transistor being output from the exponential current generation unit.

Each of the first temperature characteristic compensation unit and the se temperature characteristic compensation unit may be implemented by a current multiplier, the current multiplier comprising: a first current source for generating a current obtained by mirroring a current which is proportional to one of the gain control voltage and the reference voltage, and which is inversely proportional to the resistivity; a second current source for generating a current which is inversely proportional to the resistivity; a third current source for generating a current which is proportional to one of the gain control voltage and the reference voltage, and which is inversely proportional to the resistivity; a fourth current source for generating a current which is proportional to the temperature, and which is inversely proportional to the resistivity; a current multiplier differential amplifier including a first transistor having a base thereof connected to the first current source and the second current source, a second transistor having a base thereof connected to the third current source, emitters of the first and second transistors being connected to the fourth current source; a third transistor connected to a base of the first transistor, the first current source and the second current source; and a fourth transistor connected to a base of the second transistor and the third current source, wherein emitters of the third and fourth transistors are connected to each other, and a collector current of the first transistor being output as one of the first current and the second current.

The fourth current source may be used in place of the first current source and the third current source.

In accordance with the invention, by supplying to a variable-gain cell a current $I_{ctrl}$ output from a path block for a gain control voltage in accordance with a gain control voltage $V_{ctrl}$ and a current $I_{ref}$ output from a path block for a reference voltage, a variable-gain cell having a constant voltage gain regardless of a variation in absolute temperature is provided.

In further accordance with the invention, the control voltage generation unit in the gain control circuit is configured to generate a voltage $V_{ctrl0}$ which is proportional to a difference between a magnitude of the current $I_{ctrl}$ and the current $I_{ref}$, and which is inversely proportional to the resistivity of a resistor in the circuit, a variable-gain cell of a current switch type having a constant voltage gain regardless of a variation in absolute temperature is provided.

In further accordance with the invention, a collector current of a differential amplifier constituting an exponential current generation unit in the gain control circuit is proportional to a difference between the current $I_{ctrl}$ supplied by the path block for a gain control voltage and the current $I_{ref}$ supplied by the path block for a reference voltage. Therefore, the collector current is output from the exponential current generation unit to the variable-gain cell as a current not affected by the temperature. Therefore, a variable-gain cell of a current switch type having a constant voltage gain regardless of a variation in absolute temperature is provided.

In further accordance with the invention, the temperature characteristic compensation unit includes a current source for generating a current which is proportional to the gain control voltage $V_{ctrl}$ or the reference voltage $V_{ref}$, and which is inversely proportional to the resistivity, a current source for generating the resistivity, a current source for generating a current which is inversely proportional to the resistivity of the resistor used in the circuit, a current source for generating a current which is proportional to the absolute temperature, and which is inversely proportional to the resistor used in the circuit, and a differential amplifier. The temperature characteristic compensation unit thus constructed is capable of outputting a current which is proportional to the gain control voltage $V_{ctrl}$ or the reference voltage $V_{ref}$, which is proportional to the absolute temperature, and which is inversely proportional to the resistivity of the resistor used in the circuit. Accordingly, a variable-gain cell with little variation in the voltage gain with the absolute temperature is provided.

BRIEF DESCRIPTION OF THE DRAWINGS

Other objects and further features of the present invention will be apparent from the following detailed description and the drawings in which.

DETAILED DESCRIPTION OF THE PREFERRED EMBODIMENTS

A description will now be given of various embodiments of the present invention.

Embodiment 1

Figure 1:
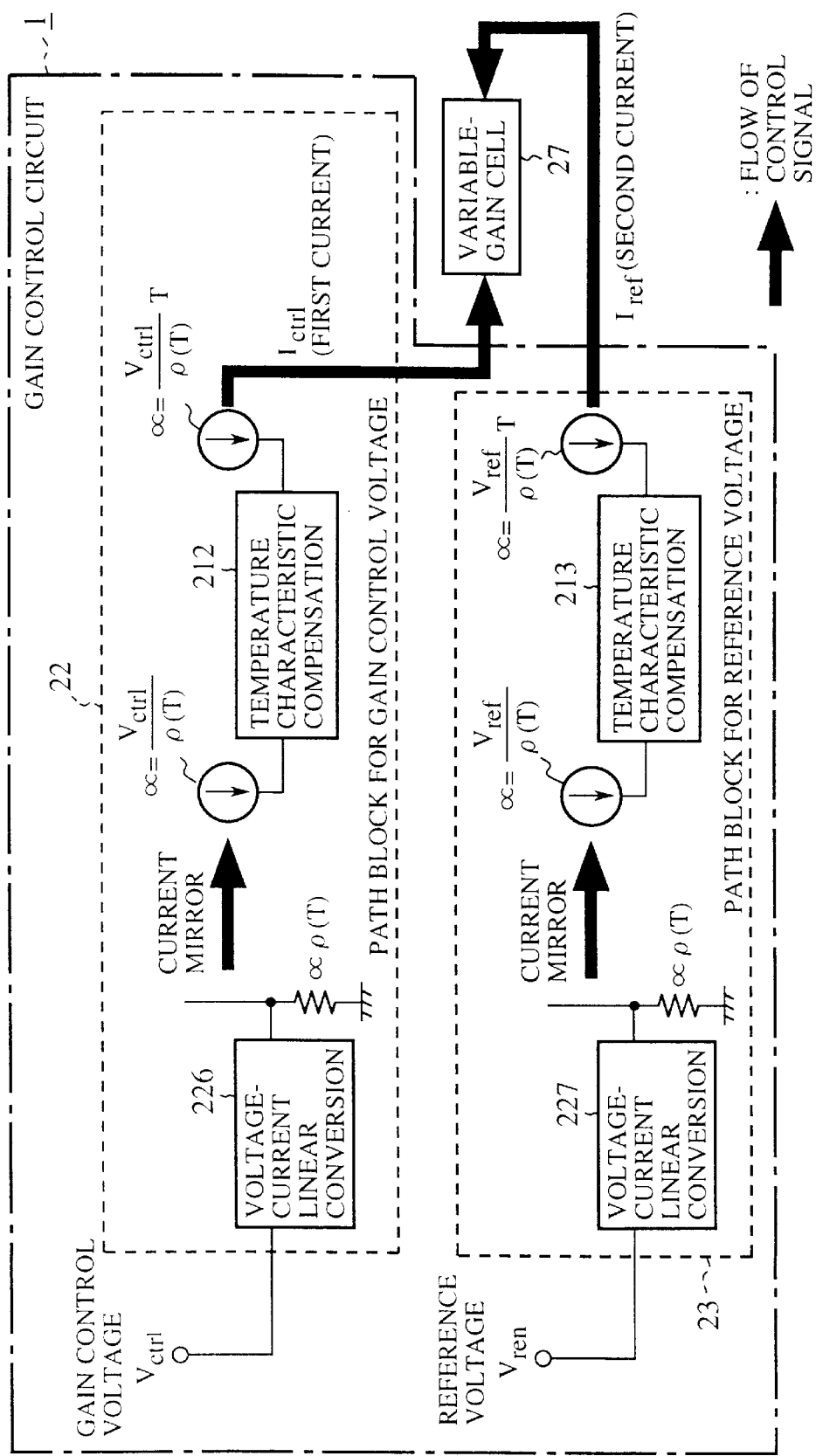
FIG. 1 is a block diagram of a gain control circuit according to a first embodiment of the present invention.

FIG. 1 is a block diagram of a gain control circuit 1 for a variable-gain amplifier according to a first embodiment of the present invention. Referring to FIG. 1, the gain control circuit 1 includes a path block 22 for a gain control voltage and a path bloc 23 for a reference voltage. The path block 22 has the gain control voltage $V_{ctrl0}$ input thereto and comprises a temperature characteristic compensation unit 212 (first temperature characteristic compensation unit) and a voltage-current linear conversion unit 226 (first voltage-current linear conversion unit). The path block 23 has the reference voltage $V_{ref}$ input thereto and comprises a temperature characteristic compensation unit 213 (second temperature characteristic compensation unit) and a voltage-current linear conversion unit 227 (second voltage-current linear conversion unit). The gain control circuit 1 controls a variable-gain amplifier 227 (variable-gain cell). In the gain control circuit 1 according to the first embodiment, the path blocks 22 and 23 have similar constructions.

The temperature characteristic compensation unit 212 outputs a current $I_{ctrl}$. The temperature characteristic compensation unit 213 outputs a current $I_{ref}$. The voltage-current linear conversion unit 226 and the voltage-current linear conversion unit 227 may be implemented by connecting a resistor at an output of a voltage follower circuit.

A description will now be given of the operation of the gain control circuit according to the first embodiment.

The path block 22 for the gain control voltage and the path block 23 for the reference voltage operate in similar manners in the gain control circuit 1 of the first embodiment. Therefore, a description of the operation will be given representatively with reference to the path block 22.

When the gain control voltage $V_{ctrl}$ is input, the voltage-current linear conversion unit 226 generates a current which is proportional to the input gain control voltage $V_{ctrl}$, and which is inversely proportional to the resistivity of a circuit resistance in the gain control circuit for the variable-gain amplifier. Hereinafter, the resistivity of the circuit resistance refers to the resistivity of the resistance in a semiconductor integrated circuit chip in which the gain control circuit and the variable-gain amplifier according to the invention are formed.

The temperature characteristic compensation unit 212 outputs the current $I_{ctrl}$ which is proportional to a current output from the voltage-current linear conversion unit 226 (more specifically, proportional to a current produced by current mirroring), which is proportional to the gain control voltage $V_{ctrl}$ and the absolute temperature (hereinafter, simply referred to as the temperature), and which is inversely proportional to the resistivity of the circuit resistance.

As has been described, the current $I_{ctrl}$ output from the path block 22 in accordance with the gain control voltage $V_{ctrl}$ and the current $I_{ref}$ output from the path block 23 in accordance with the reference voltage $V_{ref}$ are supplied to the variable-gain cell 27. By configuring the variable-gain cell 27 to operate on a difference between the current $I_{ctrl}$ and the current $I_{ref}$, the variable-gain cell 27 is capable of providing a gain performance not affected by a temperature variation. Accordingly, by using the gain control circuit 1 of the first embodiment, the variable-gain cell 27 provides a constant voltage gain regardless of temperature variation.

Embodiment 2

Figure 2:
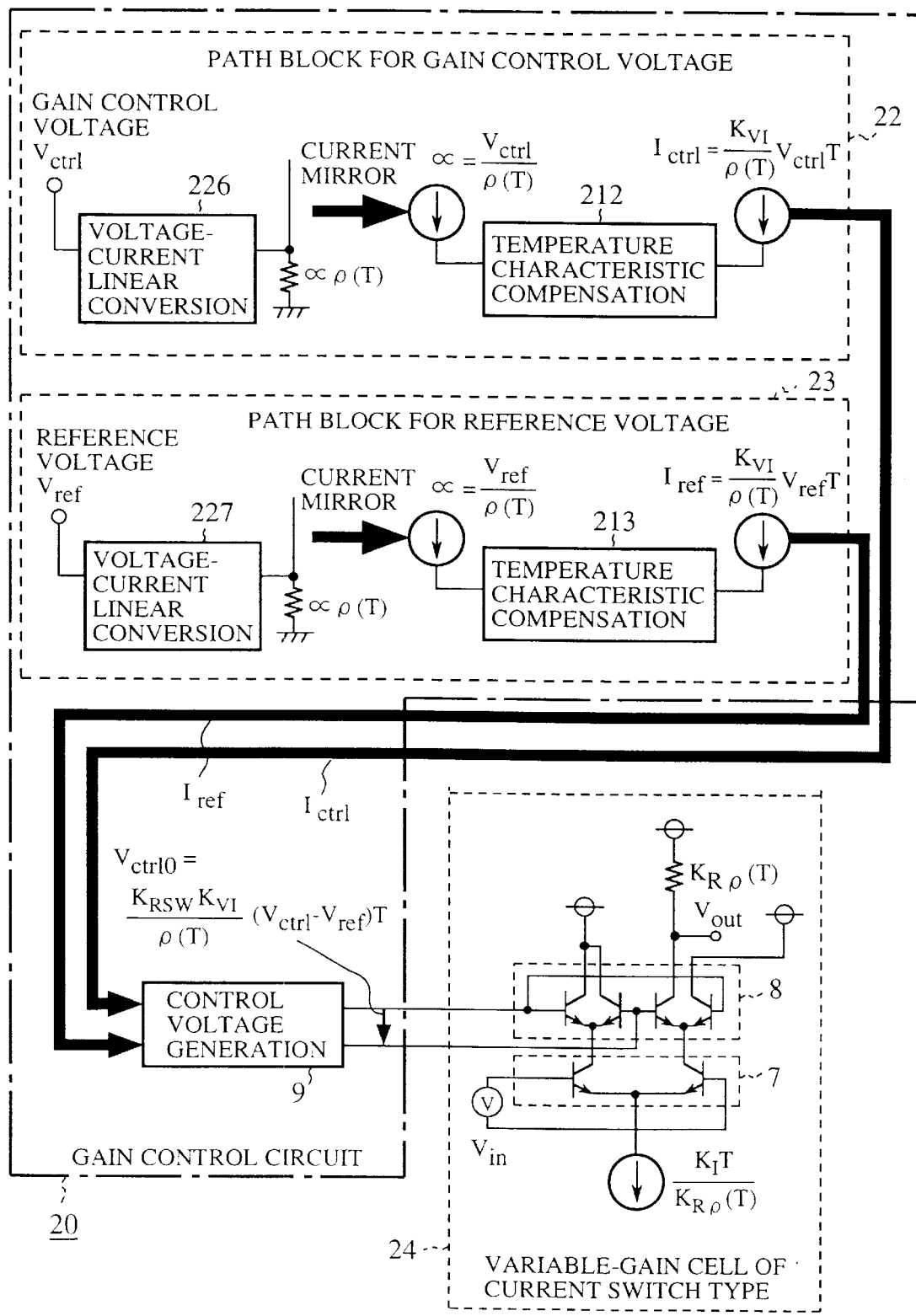
FIG. 2 is a block diagram of a control voltage generation unit in a gain control circuit according to a second embodiment of the present invention.

FIG. 2 is a block diagram of a gain control circuit for a variable-gain amplifier according to the second embodiment. Referring to FIG. 2, a gain control circuit 20 includes a control voltage generation unit 9 connected to a variable-gain cell 24 of a current switch type. The other components of the gain control circuit 20 are the same as the corresponding components of the gain control circuit 1 according to the first embodiment. Like numerals represent like components and the description thereof is omitted.

A description will now be given of the operation according to the second embodiment.

In the second embodiment, the variable-gain cell 24 of a current switch type is used in place of the variable-gain cell 27.

The current $I_{ctrl}$ (first current) output from the path block 22 and the current $I_{ref}$ (second current) output from the path block 23 are fed to the control voltage generation unit 9. The current $I_{ctrl}$ and the current $I_{ref}$ are given by the equations (5) and (6), respectively.

$$I_{ctrl} = \frac{K_{VI}}{\rho(T)} V_{ctrl} T \quad (5)$$

$$I_{ref} = \frac{K_{VI}}{\rho(T)} V_{ref} T \quad (6)$$

where $K_{VI}$ is a constant.

An output voltage $V_{ctrl0}$ of the control voltage generation unit 9 is given by the equation (7) below using the equations (5) and (6).

$$V_{ctrl0} = K_{RSW}\rho(T)(I_{ctrl} - I_{ref}) \quad (7)$$

$$= K_{RSW}\rho(T)\frac{K_{VI}}{\rho(T)}(V_{ctrl} - V_{ref})T$$

where $K_{RSW}$ is a constant.

The following equation (8) for the voltage gain $A_v$ is obtained from the equations (4) and (7).

$$A_v = \frac{q}{k}K_1\exp\left\{\frac{q}{kT}K_{RSW}\rho(T)\frac{K_{VI}}{\rho(T)}(V_{ctrl} - V_{ref})T\right\}K_R \quad (8)$$

$$= \frac{q}{k}K_1\exp\left\{\frac{q}{k}K_{RSW}K_{VI}(V_{ctrl} - V_{ref})\right\}K_R$$

The absolute temperature T is not found in the equation (8) for the voltage gain $A_v$. Therefore, variation in the voltage gain $A_v$ due to a variation in absolute temperature is eliminated.

Thus, the control voltage generation unit 9 in the gain control circuit 20 according to the second embodiment generates a voltage $V_{ctrl0}$ which is proportional to the difference between the current $I_{ctrl}$ and the current $I_{ref}$, and which is inversely proportional to the resistivity of the circuit resistance. The voltage $V_{ctrl0}$ thus generated is supplied to the variable-gain cell 24. Accordingly, by using the gain control circuit 20 according to the second embodiment, the variable-gain cell 24 of a current switch type having a constant voltage gain regardless of a variation in the absolute temperature is obtained.

Embodiment 3

Figure 3:
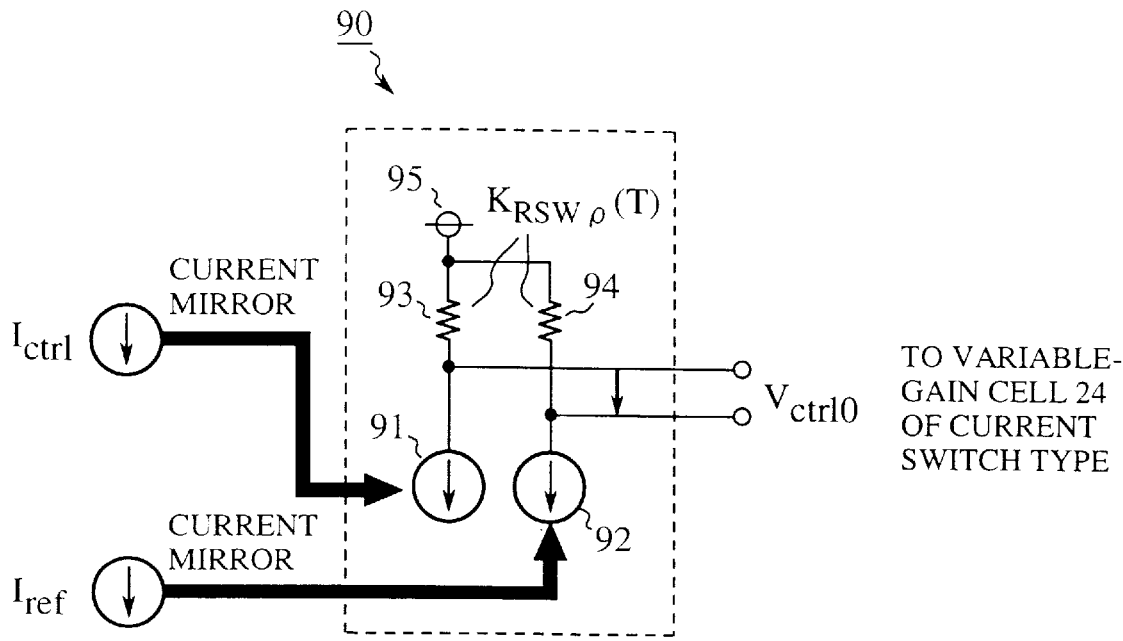
FIG. 3 is a detailed circuit diagram of a control voltage generation unit in a gain control circuit according to a third embodiment of the present invention.

FIG. 3 is a detailed circuit diagram of a control voltage generation unit 90 in a gain control circuit according to a third embodiment. Referring to FIG. 3, the control voltage generation unit 90 includes a first current source 91, a second current source 92, a first resistor 93, a second resistor 94 and a power source 95. The other components of the gain control circuit according to the third embodiment are the same as the corresponding components of the gain control circuit according to the second embodiment.

A description will now be given of the operation of the control voltage generation unit 90 according to the third embodiment.

The first current source 91 in the control voltage generation unit 90 generates a current by mirroring the current $I_{ctrl}$ output from the path block 22. The current source 92 generates a current by mirroring the current $I_{ref}$ output from the path block 23.

The resistor 93 has one end thereof connected in series with the current source 91 and the other end connected to the power source 95. Similarly, the resistor 94 has one end thereof connected in series with the second current source 92 and the other end connected to the power source 95. The resistors 93 and 94 have the same resistance.

The voltage $V_{ctrl0}$ generated across the node between the current source 91 and the resistor 93 and the node between the current source 92 and the resistor 94 is supplied to the variable-gain cell 24 of a current switch type.

Thus, according to the third embodiment, the control voltage generation unit 90 generates the voltage $V_{ctrl0}$ which is proportional to the difference between the current $I_{ctrl}$ and the current $I_{ref}$, and which is inversely proportional to the resistivity of the circuit resistance. The voltage $V_{ctrl0}$ thus generated is supplied to the variable-gain cell 24. Accordingly, by using the gain control circuit in which the control voltage generation circuit 90 is incorporated, a variable-gain cell having a constant voltage gain regardless of a variation in the absolute temperature is available.

Embodiment 4

Figure 4:
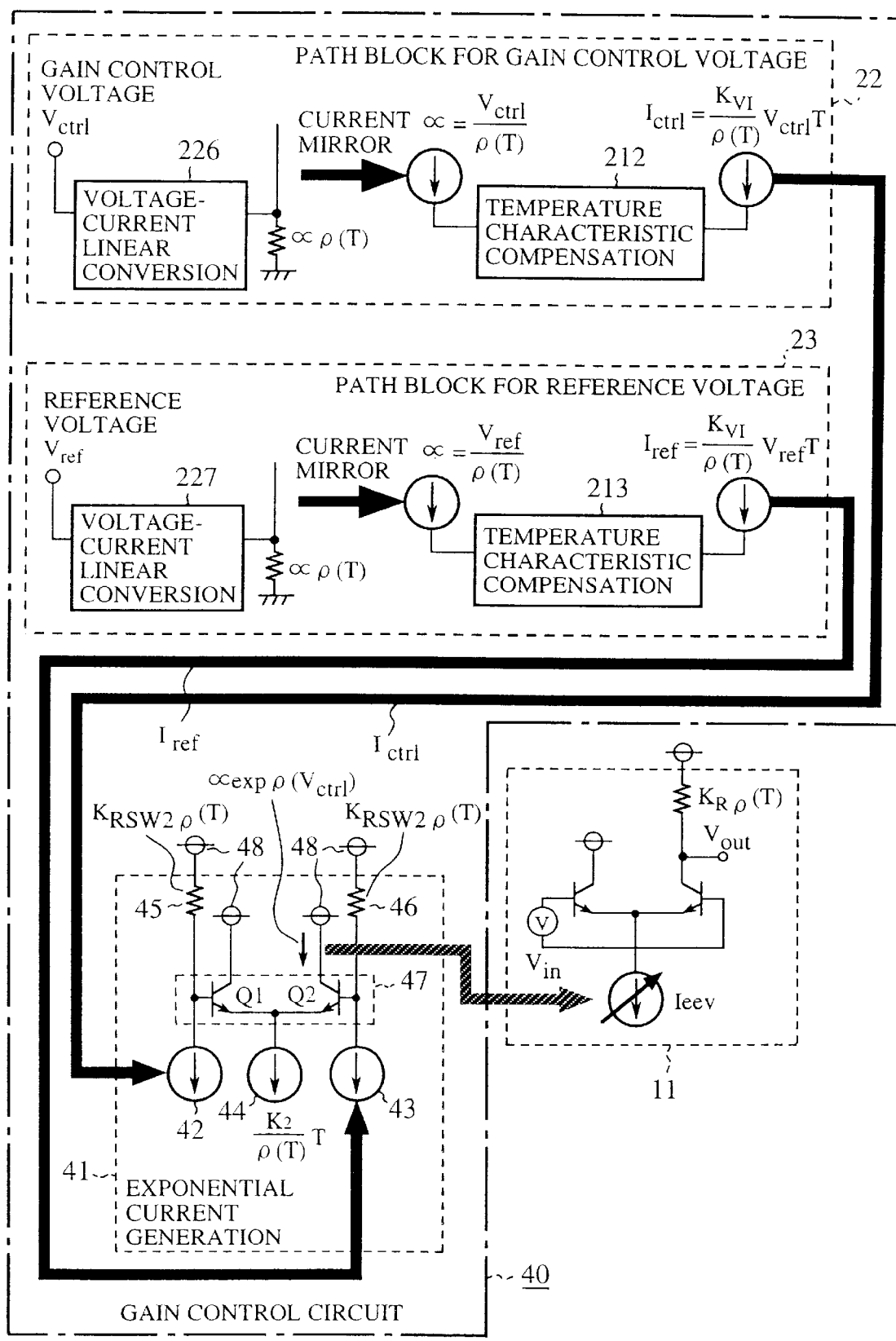
FIG. 4 is a block diagram showing a gain control circuit according to a fourth embodiment of the present invention.

FIG. 4 is a block diagram of a gain control circuit 40 according to the fourth embodiment. The gain control circuit 40 includes an exponential current generation unit 41. The exponential current generation unit 41 comprises current sources 42–44, a differential amplifier 47 and current-voltage conversion resistors 45 and 46. The current source 42 provides a current which is proportional to the current $I_{ref}$ supplied by the path block 23, the current source 43 provides a current which is proportional to the current $I_{ctrl}$ supplied by the path block 22, and the current source 44 provides a current which is proportional to the absolute temperature, and which is inversely proportional to the resistivity of the circuit resistance. In the fourth embodiment, the current provided by the gain control circuit 40 controls the operation of a variable-gain cell 11 having a variable current source.

The differential amplifier 47 is formed of a first transistor Q1 and a second transistor Q2, the first transistor Q1 having the base thereof connected to the current source 42 and also connected to a power source 48 via the current-voltage conversion resistor 45, and a second transistor Q2 having the base thereof connected to the current source 43 and also connected to the power source 48 via the current-voltage conversion resistor 46.

In the differential amplifier 47, the base of the second transistor Q2 is connected to the node between the current-voltage conversion resistor 46 and the current source 43. Similarly, the base of the first transistor Q1 is connected to the node between the current-voltage conversion resistor 45 and the current source 42.

The emitters of the transistors Q1 and Q2 are connected to the current source 44.

Instead of the variable-gain cell 27 described in the first embodiment, the gain control circuit 40 according to the fourth embodiment shown in FIG. 4 controls the variable-gain cell 11 having a variable current source. The other components are identical to the corresponding components of the variable-gain circuit 1 according to the first embodiment. Like numerals represent like components, and the description thereof will be omitted.

A description will now be given of the operation according to the fourth embodiment.

In the gain control circuit 40 according to the fourth embodiment, the current $I_{ref}$ output from the path block 22 and the current $I_{ctrl}$ output from the path block 23 are fed to the exponential current generation unit 41. The exponential current generation unit 41 generates a current which is proportional to the exponential of a difference between currents that are respectively proportional to the current $I_{ref}$ and the current $I_{ctrl}$. The current thus generated by the exponential current generation unit 41 is output to the variable-gain cell 11.

As shown in FIG. 4, a current $I_{eev}$ in the variable-gain cell 11 is obtained by mirroring the collector current of the differential amplifier 47 output from the exponential current generation unit 41. The current $I_{eev}$ is given by the equation (9) below.

$$I_{eev} = \frac{\frac{K_2}{\rho(T)}T}{1 + \exp\left\{-\frac{q}{kT}K_{sw2}\rho(T)(I_{ctrl} - I_{ref})\right\}} \quad (9)$$

where $K_2$ is a constant.

By setting the current $I_{ctrl}$ and the current $I_{ref}$ so as to satisfy the inequality below, and by substituting the equations (5) and (6) in the equation (9), the following equation

(10) is obtained.

$$\exp\left\{-\frac{q}{kT}K_{sw2}\rho(T)(I_{ctrl}-I_{ref})\right\} \gg 1 \quad (10)$$

$$I_{eev} = \frac{K_2}{\rho(T)}T\exp\left\{\frac{q}{kT}K_{sw2}(T)(I_{ctrl}-I_{ref})\right\}$$

$$= \frac{K_2}{\rho(T)}T\exp\left\{\frac{q}{kT}\frac{K_{VI}}{\rho(T)}K_{sw2}\rho(T)(V_{ctrl}-V_{ref})T\right\}$$

Accordingly, a voltage gain $A_{v1}$ is given by the equation (11) below.

$$A_{v1} = \frac{q}{kT}I_{eev}K_R\rho(T) \quad (11)$$

From the equations (10) and (11), the voltage gain $A_{v1}$ is given by the equation (12) below.

$$A_{v1} = \frac{q}{kT}\frac{K_2}{\rho(T)}T\exp\left\{\frac{q}{kT}\frac{K_{VI}}{\rho(T)}K_{sw2}\rho(T)(V_{ctrl}-V_{ref})\right\}K_R\rho(T) \quad (12)$$

$$= \frac{q}{k}K_2\exp\left\{\frac{q}{k}K_{VI}K_{sw2}(V_{ctrl}-V_{ref})\right\}K_R$$

Since the temperature T is not found in the equation (12) above for the voltage gain $A_{v1}$, the temperature characteristic of the transistors is compensated. That is, in the variable-gain cell 11, no variation is caused in the gain due to a variation in the absolute temperature.

According to the fourth embodiment, the collector current of the differential amplifier 47 is proportional to the exponential of the difference between the current $I_{ctrl}$ and the current $I_{ref}$. Accordingly, the current having no temperature dependence is output from the exponential current generation unit 41 to the variable-gain cell 11. As a result, variation in the voltage gain $A_{v1}$ due to a variation in the absolute temperature is eliminated in the variable-gain cell.

Embodiment 5

Figure 5:
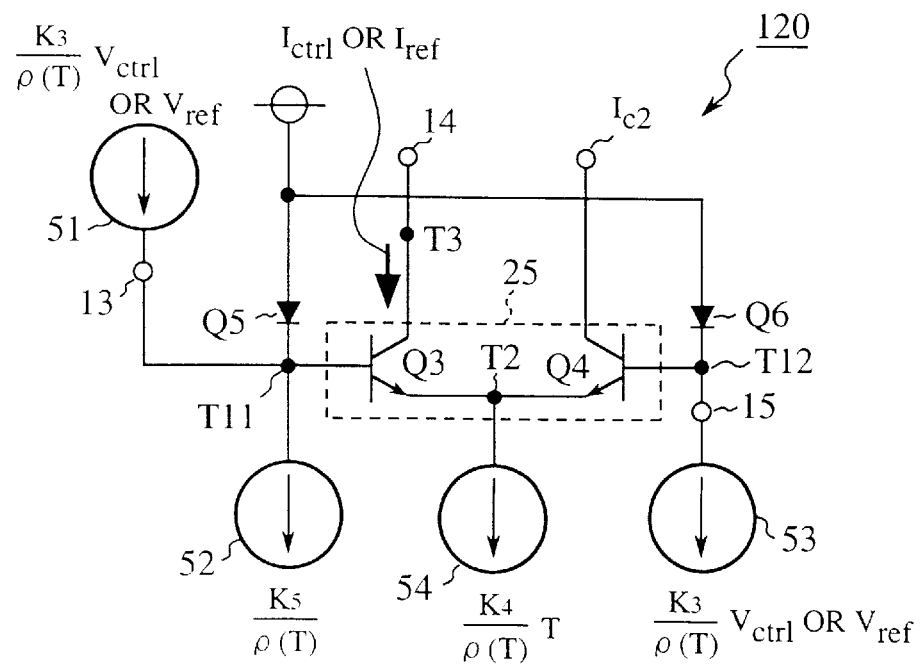
FIG. 5 is a detailed circuit diagram showing the detailed construction of a temperature characteristic compensation unit in a gain control circuit according to a a fifth embodiment of the present invention.

FIG. 5 is a circuit diagram showing a temperature characteristic compensation unit 120 in the gain control circuit according to the fifth embodiment. FIG. 5 actually shows the detail of the temperature characteristic compensation units 212 and 213 in the gain control circuit 1 according to the first embodiment. Referring to FIG. 5, the temperature characteristic compensation unit 120 includes current sources 51–54 and a differential amplifier 25.

The differential amplifier is formed of a transistor Q3 and a transistor Q4, the transistor Q3 having the base thereof connected to the current sources 51 and 52, and the transistor Q4 having the base thereof connected to the current source 53. Node T11 connected to the base of the transistor Q3 is connected to the current sources 51 and 52, and also to a transistor Q5 in a diode arrangement. Node T12 connected to the base of the transistor Q4 is connected to the current source 53 and a transistor Q6 in a diode arrangement. Each of the other end of the transistors Q5 and Q6, that is, each of the emitters thereof, is connected to a common power source. It is assumed herein that the transistors Q5 and Q6 have the same characteristic.

Each of the emitters of transistors Q3 and Q4 in the differential amplifier 25 is connected to node T2. Node T2 (common emitter) is connected to the current source 54 for generating a current which is proportional to the absolute temperature, and which is inversely proportional to the resistivity of the circuit resistance.

The components of the gain control circuit other than the temperature characteristic compensation unit 120 are identical to the corresponding components of the gain control circuit 1 according to the first embodiment and are not shown. Like numerals represent like components and the description thereof is omitted A description will now be given of the operation of the temperature characteristic compensation unit 120.

In the temperature characteristic compensation unit 120 implemented as a current multiplier shown in FIG. 5, a current which is proportional to the gain control voltage $V_{ctrl}$, and which is inversely proportional to the resistivity of the circuit resistance is fed to an input terminal 13 by the current source 51. A current of the same magnitude is drawn by the current source 53 via a current multiplier current input terminal 15 (connected to node T12).

Further, a current inversely proportional to the resistivity of the circuit resistance is drawn by the current source 52 via node T11. A current which is proportional to the absolute temperature, and which is inversely proportional to the resistivity of the circuit resistance is drawn by the current source 54 via node T2 connected to the emitters of the transistors Q3 and Q4.

The temperature characteristic compensation circuit shown in FIG. 5 may also be configured such that a current which is proportional to the reference voltage $V_{ref}$, and which is inversely proportional to the resistivity of the circuit resistance is fed by the current source 51 via the input terminal 13. A current of the same magnitude may be drawn by the current source 53 via the current input terminal 15 (T12).

Further, a current which is inversely proportional to the resistivity of the circuit resistance may be drawn by the current source 52 via node T11. A current which is proportional to the absolute temperature, and which is inversely proportional to the resistivity of the circuit resistance may be drawn by the current source 54.

Thus, the currents $I_{ctrl}$ and $I_{ref}$ are output via node T3 at the output of the current multiplier constituting the temperature characteristic compensation unit 120, node T3 being connected to a collector terminal 14 of the transistor Q3.

A current given by $$(K_3/\rho(T))V_{ctrl}$$

which is proportional to the gain control voltage $V_{ctrl}$, and which is inversely proportional to the resistivity of the circuit resistance is supplied to the input terminals 13 and 15 of the current multiplier. Notation $K_5/\rho(T)$ at the current source 52 indicates a current which is dependent only on the resistivity of the circuit resistance. A current $K_4/\rho(T)$ which is proportional to the absolute temperature, and which is inversely proportional to the resistivity of the circuit resistance is provided by the current source 54 as an emitter current of the differential amplifier 25. $K_3$, $K_4$ and $K_5$ indicate constants.

Calculating a sum of the base-emitter voltages in a loop comprising the transistors Q3–Q6, the following equation (13) is obtained.

$$-V_T\ln\left\{\frac{\frac{K_5}{\rho(T)}-\frac{K_3}{\rho(T)}V_{ctrl}}{I_s}\right\}- \quad (13)$$

-continued $$V_T \ln\left(\frac{I_{c2}}{I'_s}\right) + V_T \ln\left(\frac{I_{ctrl}}{I'_s}\right) + V_T \ln\left\{\frac{\frac{K_3}{\rho(T)} V_{ctrl}}{I_s}\right\}$$

$$= 0$$

$$\frac{K_3 V_{ctrl} I_{c2}}{(K_5 - K_3 V_{ctrl}) I_{ctrl}} = 1$$

$$I_{ctrl} : I_{c2} = K_3 V_{ctrl} : (K_5 - K_3 V_{ctrl})$$

$$\frac{I_{ctrl}}{I_{ctrl} + I_{c2}} = \frac{K_3 V_{ctrl}}{K_5}$$

where $I_s$ and $I'_s$ indicate constants.

Substituting $V_T = kT/q$ and the equation (14) below in the equation (13), the equation (15) is obtained.

$$I_{c2} + I_{ctrl} = \frac{K_4}{\rho(T)} T \quad (14)$$

$$I_{ctrl} = \frac{K_3 K_4}{K_5 \rho(T)} V_{ctrl} T \quad (15)$$

As the equation (15) shows, the temperature characteristic compensation unit 120 shown in FIG. 5 is capable of outputting a current which is proportional to the gain control voltage $V_{ctrl}$ and the absolute temperature T, and which is inversely proportional to the resistivity of the circuit resistance.

As has been described, by constituting the temperature characteristic compensation unit 120 using the current sources 51 and 53 for generating a current which is proportional to the gain control voltage $V_{ctrl}$ or the reference voltage $V_{ref}$, and which is inversely proportional to the resistivity of the resistor used in the circuit, using the current source 52 for generating a current which is inversely proportional to the resistivity of the circuit resistance, using the current source 54 for generating a current which is proportional to the absolute temperature, and which is inversely proportional to the resistivity of the circuit resistance, and also using the differential amplifier 25, the temperature characteristic compensation unit 120 is capable of outputting a current which is proportional to the gain control voltage $V_{ctrl}$ or the reference voltage $V_{ref}$, which is proportional to the absolute temperature T, and which is inversely proportional to the resistivity of the circuit resistance. Accordingly, a variable-gain cell free from voltage gain variation with absolute temperature is provided.

Embodiment 6

Figure 6:
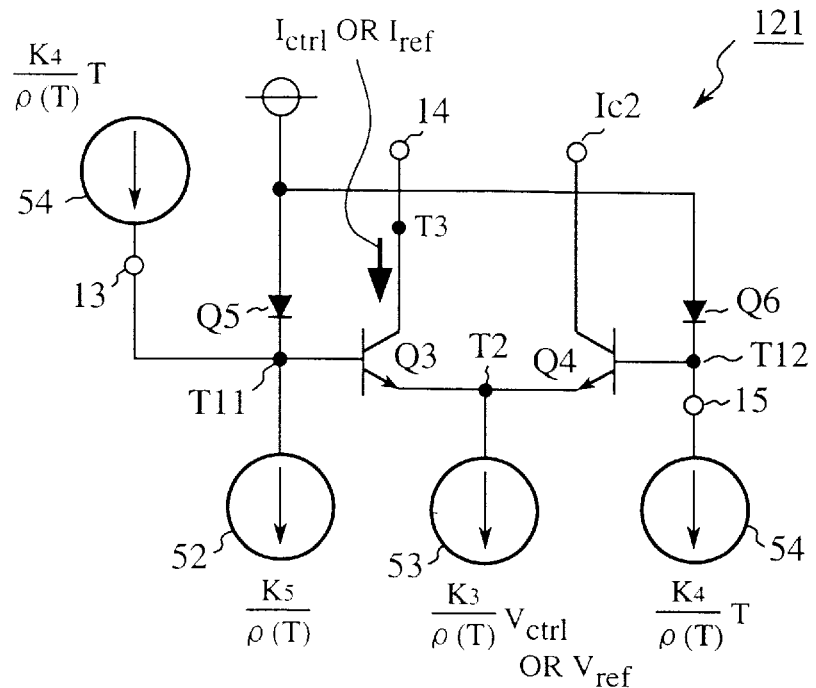
FIG. 6 is a circuit diagram showing the construction of a temperature characteristic compensation unit in a gain control circuit according to a sixth embodiment of the present invention.
Figure 7:
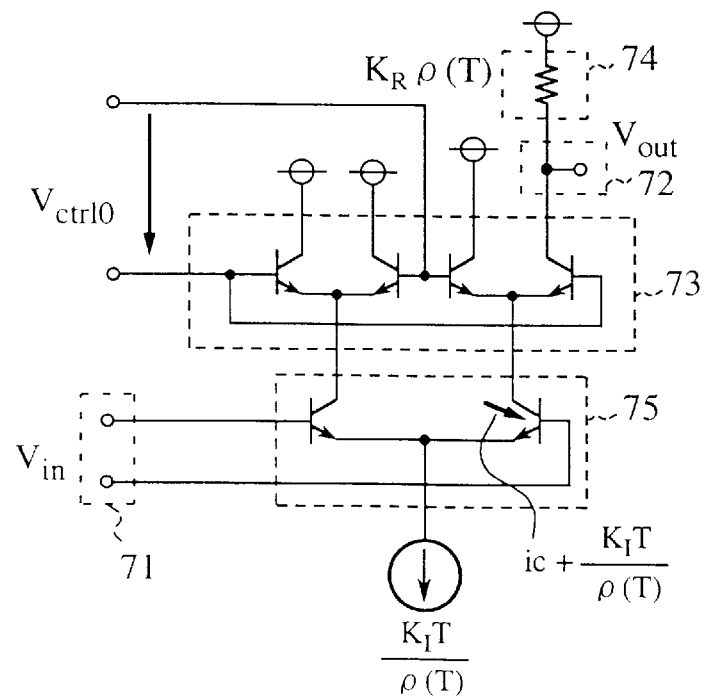
FIG. 7 is a circuit diagram showing a variable-gain amplifier (variable-gain cell) of a current switch type according to the related art.
Figure 8:
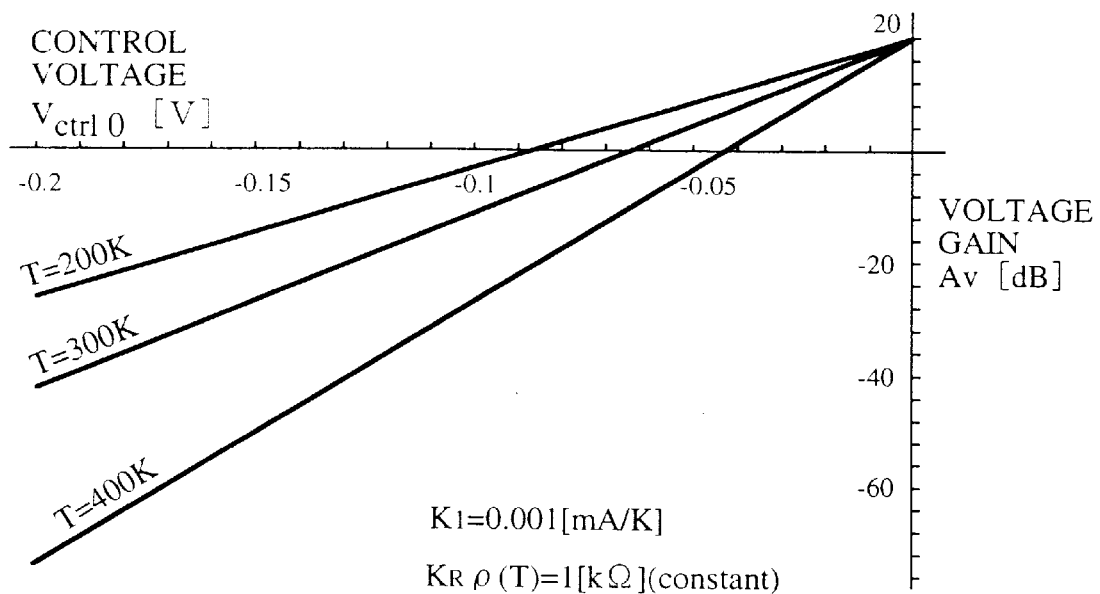
FIG. 8 is a graph showing a temperature dependence of a variable-gain amplifier according to the related art.

FIG. 6 is a circuit diagram of a temperature characteristic compensation unit in a gain control circuit according to the sixth embodiment. FIG. 6 shows a temperature characteristic compensation unit 121 according to a variation of the temperature characteristic compensation unit 120 shown in FIG. 5. Referring to FIG. 6, the temperature characteristic compensation unit 121 has the same components as the temperature characteristic compensation unit 120. Like numerals represent like components, and the description thereof is omitted.

In the temperature characteristic compensation unit 121 according to the sixth embodiment, the current sources 51 and 53 in the temperature characteristic compensation unit 120 are replaced by the current source 54, and the current source 54 in the temperature characteristic compensation unit 120 is replaced by the current source 53. The other aspects of the temperature characteristic compensation unit 121 according to the sixth embodiment are the same as the corresponding aspects of the fifth embodiment.

A description will now be given of the operation of the temperature characteristic compensation unit 121.

In the temperature characteristic compensation unit 121 implemented by a current multiplier shown in FIG. 6, a current which is inversely proportional to the resistivity of the circuit resistance, and which is proportional to the absolute temperature is fed by the current source 54 to the input terminal 13. A current of the same magnitude is drawn by the current source 54 via the input terminal 15 (connected to node T12) of the current multiplier.

A current which is inversely proportional to the resistivity of the circuit resistance is drawn by the current source 52 via node T11. A current which is proportional to the gain control voltage $V_{ctrl}$ or the reference voltage $V_{ref}$, and which is inversely proportional to the resistivity of the circuit resistance is fed by the current source 53 via node T2.

Thus, the current $I_{ctrl}$ or the current $I_{ref}$ is output via node T3 at the output of the current multiplier constituting the temperature characteristic compensation unit 121, node T3 being connected to the collector terminal 14 of the transistor Q3.

Thus, by constituting the temperature characteristic compensation unit 121 using the current source 53 for generating a current which is proportional to the gain control voltage $V_{ctrl}$ or the reference voltage $V_{ref}$, and which is inversely proportional to the resistivity of the circuit resistance, using the current source 52 for generating a current which is inversely proportional to the resistivity of the circuit resistance, using the current source 54 for generating a current which is proportional to the absolute temperature, and which is inversely proportional to the resistivity of the circuit resistance, and also using the differential amplifier 25, the temperature characteristic compensation unit 121 is capable of outputting a current which is proportional to the gain control voltage $V_{ctrl}$ or the reference voltage $V_{ref}$, which is proportional to the absolute temperature T, and which is inversely proportional to the resistivity of the circuit resistance. Accordingly, a variable-gain cell free from voltage gain variation with absolute temperature is provided.

The present invention is not limited to the above-described embodiments, and variations and modifications may be made without departing from the scope of the present invention.

What is claimed is:

1. A gain control circuit comprising:
   a first voltage-current linear conversion unit for receiving a gain control voltage and outputting a current which is proportional to the gain control voltage, and which is inversely proportional to a resistivity of a resistance in the gain control circuit;
   a first temperature characteristic compensation unit for receiving a current obtained by mirroring the current output by said first voltage-current linear conversion unit and for outputting a first current which is proportional to the gain control voltage and a temperature, and which is inversely proportional to the resistivity;
   a second voltage-current linear conversion unit for receiving a reference voltage and outputting a current which is proportional to the reference voltage, and which is inversely proportional to the resistivity; and
   a second temperature characteristic compensation unit for receiving a current obtained by mirroring the current output by said second voltage-current linear conversion unit and for outputting a second current which is proportional to the reference voltage, and the temperature, and which is inversely proportional to the resistivity.

2. The gain control circuit according to claim 1, further comprising a control voltage generation unit for receiving the first current and the second current and generating a voltage which is proportional to a difference between a magnitude of the first current and that of the second current, and which is inversely proportional to the resistivity.

3. The gain control circuit according to claim 2, wherein said control voltage generation unit further comprises:

a first control voltage generation current source for generating a mirror current of the first current;

a second control voltage generation current source for generating a mirror current of the second current;

a first resistor connected in series with said first control voltage generation current source;

a second resistor connected in series with said second control voltage generation current source, wherein
said first resistor and said second resistor are connected to a common power source, and wherein a voltage is retrieved across a connection node between said first control voltage generation current source and said first resistor, and a connection node between said second control voltage generation current source and said second resistor.

4. The gain control circuit according to claim 1, further comprising an exponential current generation unit which receives the first current and the second current, said exponential current generation unit further comprising:

a first exponential current generation current source for generating a mirror current of the first current;

a second exponential current generation current source for generating a mirror current of the second current;

a third exponential current generation current source for generating a current which is proportional to the temperature, and which is inversely proportional to the resistivity; and a differential amplifier including a first differential amplifier transistor having a base thereof connected to said first exponential current generation current source and connected to a common power source via a resistor, and a second differential amplifier transistor having a base thereof connected to said second exponential current generation current source and connected to the common power source via another resistor, emitters of said first and second differential amplifier transistors being connected to said third exponential current generation current source, and a collector current of said second differential amplifier transistor being output from said exponential current generation unit.

5. The gain control circuit according to claim 1, wherein each of said first temperature characteristic compensation unit and said second temperature characteristic compensation unit is implemented by a current multiplier, said current multiplier comprising:

a first current source for generating a current obtained by mirroring a current which is proportional to one of the gain control voltage and the reference voltage, and which is inversely proportional to the resistivity;

a second current source for generating a current which is inversely proportional to the resistivity;

a third current source for generating a current which is proportional to one of the gain control voltage and the reference voltage, and which is inversely proportional to the resistivity;

a fourth current source for generating a current which is proportional to the temperature, and which is inversely proportional to the resistivity;

a current multiplier differential amplifier including a first transistor having a base thereof connected to said first current source and said second current source, a second transistor having a base thereof connected to said third current source, emitters of said first and second transistors being connected to said fourth current source;

a third transistor connected to a base of said first transistor, said first current source and said second current source; and a fourth transistor connected to a base of said second transistor and said third current source, wherein
emitters of said third and fourth transistors are connected to each other, and a collector current of said first transistor being output as one of the first current and the second current.

6. The gain control circuit according to claim 5, wherein said fourth current source is used in place of said first current source and said third current source.

* * * * *